(12) United States Patent
Chen et al.

(10) Patent No.: US 12,727,302 B2
(45) Date of Patent: Sep. 1, 2026

(54) MICRO LIGHT-EMITTING DIODE DEVICE

(71) Applicant: MIKRO MESA TECHNOLOGY CO., LTD., Apia (WS)

(72) Inventors: Li-Yi Chen, Tainan City (TW); Hsin-Wei Lee, Tainan City (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 392 days.

(21) Appl. No.: 18/182,391

(22) Filed: Mar. 13, 2023

(65) Prior Publication Data

US 2024/0313175 A1 Sep. 19, 2024

(51) Int. Cl.

*H10H 20/855* (2025.01)
*H10H 20/825* (2025.01)
*H10H 20/833* (2025.01)
*H10H 20/852* (2025.01)

(52) U.S. Cl.

CPC ........ *H10H 20/855* (2025.01); *H10H 20/825* (2025.01); *H10H 20/833* (2025.01); *H10H 20/852* (2025.01)

(58) Field of Classification Search

CPC ............... H10H 20/825; H10H 20/833; H10H 20/00–882; H10H 29/00–142; H10H 29/30–962

See application file for complete search history.

(56) References Cited

U.S. PATENT DOCUMENTS 6,456,640 B1 * 9/2002 Okumura ............ H01S 5/34333 372/46.01
2004/0217371 A1 * 11/2004 Okumura ............... B82Y 20/00 257/103
2006/0157730 A1 * 7/2006 Otsuka ................... H10D 62/82 257/190
2010/0155742 A1 * 6/2010 Takeuchi ............... H10H 20/81 257/101
2011/0001148 A1 * 1/2011 Sun ...................... H10H 20/856 257/E33.059
2011/0079798 A1 * 4/2011 Ogihara ............... H10H 20/831 257/E33.044

(Continued)

OTHER PUBLICATIONS

Bashir, Designing of High Reflectance Distributed Bragg Reflectors mirrors using AlGaInN material system in the UV wavelength range, Jun. 2009 (Year: 2009).*

(Continued)

*Primary Examiner* — Ismail A Muse
(74) *Attorney, Agent, or Firm* — CKC & Partners Co., LLC

(57) ABSTRACT

A micro light-emitting diode device includes a substrate, a micro light-emitting diode, and a transparent top electrode. The micro light-emitting diode is disposed on the substrate and includes a p-type GaN layer, an n-type III-nitride layer above the p-type GaN layer, an n-doped AlN layer above and in contact with the n-type III-nitride layer, and an active layer between the p-type GaN layer and the n-type III-nitride layer. The transparent top electrode covers and is in contact with the n-doped AlN layer. A refractive index of the n-doped AlN layer is smaller than a refractive index of the n-type III-nitride layer. A sum of the thicknesses of the n-type III-nitride layer and the n-doped AlN layer is greater than a sum of the thicknesses of the active layer and the p-type GaN layer.

18 Claims, 9 Drawing Sheets

(56) References Cited

U.S. PATENT DOCUMENTS

| | | | | |
|---|---|---|---|---|
| 2014/0339495 | A1* | 11/2014 | Bibl | H01L 25/0753 257/13 |
| 2015/0311463 | A1* | 10/2015 | Park | H10K 50/156 257/40 |
| 2019/0067523 | A1* | 2/2019 | Kinoshita | H10H 20/831 |
| 2019/0130821 | A1* | 5/2019 | Ogonowsky | H10H 20/853 |
| 2020/0411716 | A1* | 12/2020 | Grandusky | H10H 20/018 |
| 2022/0059723 | A1* | 2/2022 | Ebata | H10H 20/811 |
| 2024/0222575 | A1* | 7/2024 | Wang | H10H 20/831 |

OTHER PUBLICATIONS

Maria et al., 2D/3D graphene on h-BN interlayer-silicon solar cell with ZnO:Al buffer layer and enormous light captivation using Au/Ag NPs, Apr. 2020, vol. 28, No. 9 / 27, p. 8 (Year: 2020).*

* cited by examiner 100C
150
110
111
130
140
124
123
122
121
120

100F
110
111
170
130
140
124
123
122
121
120

MICRO LIGHT-EMITTING DIODE DEVICE

BACKGROUND

Field of Invention

The present disclosure relates to a micro light-emitting diode device.

Description of Related Art

The statements in this section merely provide background information related to the present disclosure and do not necessarily constitute prior art.

As a light source, light-emitting diodes (LEDs) have many advantages, including low energy consumption, long lifetime, small size, and fast switching. Hence, conventional lighting, such as incandescent lighting, is gradually replaced by LED lights. The properties regarding LEDs also fit applications on displays. Researches on displays using micro light-emitting devices, or specifically, micro light-emitting diodes (micro LEDs), have become popular in recent years. Commercial lighting applications made of micro LEDs are nearly within reach.

GaN (InGaN, AlGaN) based LEDs have become the majority of LED Illumination. Since the GaN based LED display gradually becomes mainstream in the display market, searching for better performance for the GaN based LED display becomes an important topic, and the display industries are starting to pay attention on it.

SUMMARY

According to some embodiments of the present disclosure, a micro light-emitting diode device includes a substrate, a micro light-emitting diode, and a transparent top electrode. The micro light-emitting diode has a lateral width smaller than 100 μm. The micro light-emitting diode is disposed on the substrate and includes a p-type GaN layer, an n-type III-nitride layer, an n-doped AlN layer, and an active layer. The n-type III-nitride layer is above the p-type GaN layer. III refers to at least one of aluminum, gallium, and indium. The n-doped AlN layer is above and in contact with the n-type III-nitride layer. A thickness of the n-doped AlN layer is greater than 10 nm. The active layer is between the p-type GaN layer and the n-type III-nitride layer. The transparent top electrode at least partially covers and is in contact with the n-doped AlN layer. A refractive index of the n-doped AlN layer is smaller than a refractive index of the n-type III-nitride layer. A sum of thicknesses of the p-type GaN layer, the active layer, the n-type III-nitride layer, and the n-doped AlN layer is greater than 400 nm. A sum of the thicknesses of the n-type III-nitride layer and the n-doped AlN layer is greater than a sum of the thicknesses of the active layer and the p-type GaN layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
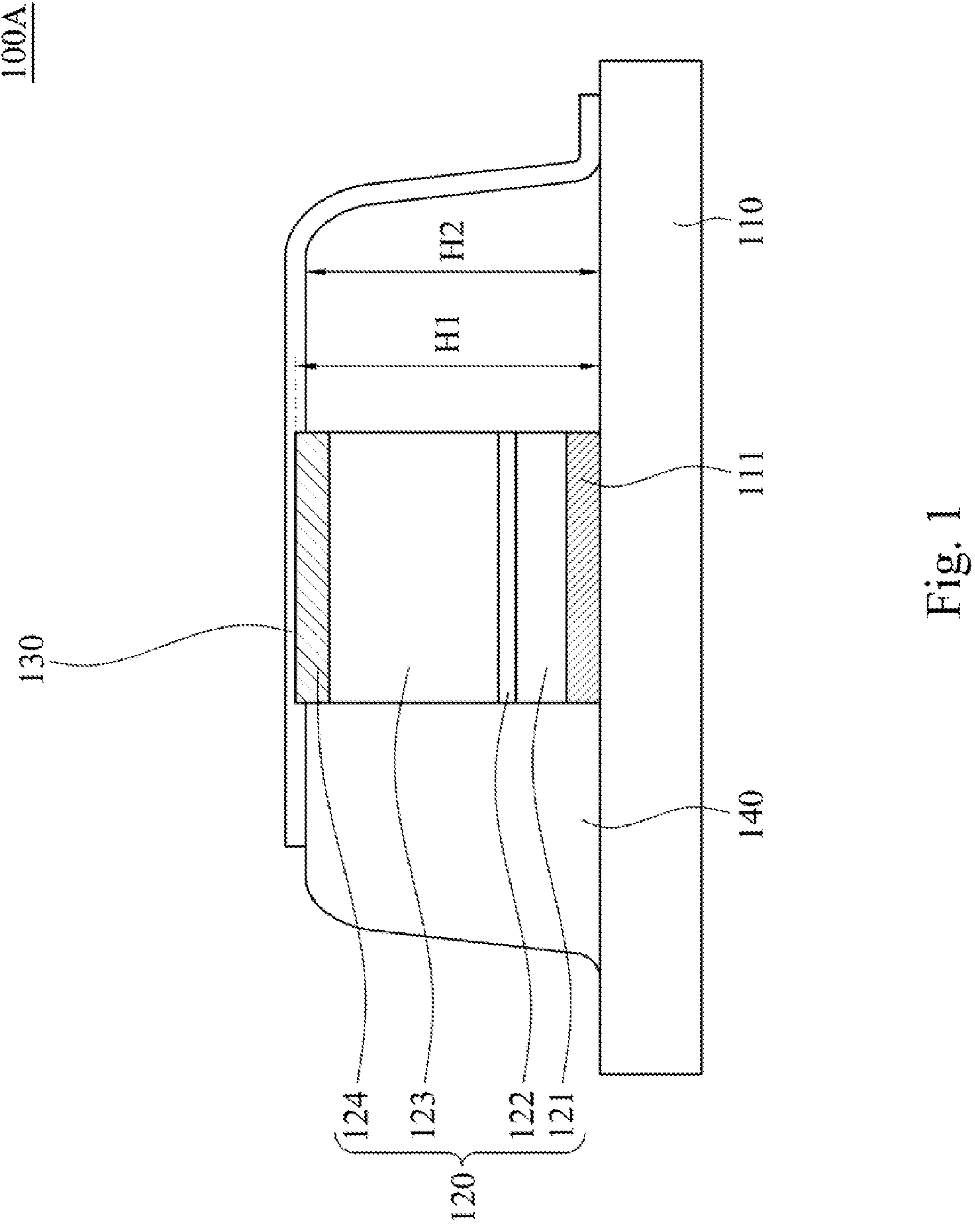
FIG. 1 is a schematic cross-sectional view of a micro light-emitting diode device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

The terms "micro" device, "micro" p-n diode or "micro" LED as used herein may refer to the descriptive size of certain devices or structures according to embodiments of the present disclosure. As used herein, the terms "micro" devices or structures may be meant to refer to the scale of 1 to 100 μm. However, it is to be appreciated that embodiments of the present disclosure are not necessarily so limited, and that certain aspects of the embodiments may be applicable to larger, and possibly smaller size scales. The refractive index mentioned in the following, unless otherwise specified, is based on the refractive index of light with a wavelength λ of 550 nm.

Reference is made to FIG. 1. FIG. 1 is a schematic cross-sectional view of a micro light-emitting diode device 100A according to some embodiments of the present disclosure. As shown in FIG. 1, in some embodiments, the micro light-emitting diode device 100A includes a substrate 110, a micro light-emitting diode 120, and a transparent top electrode 130. The micro light-emitting diode 120 has a lateral width smaller than 100 μm. For example, the lateral width is the width of micro light-emitting diode 120 shown in FIG. 1. The substrate 110 has a metal pad 111 thereon. The micro light-emitting diode 120 is disposed on the substrate 110 and includes a p-type GaN layer 121, an n-type III-nitride layer 123, an n-doped AlN layer 124, and an active layer 122. The n-type III-nitride layer 123 is above the p-type GaN layer 121. “III” (group III) of the n-type III-nitride layer 123 refers to (or consists of) at least one element of aluminum, gallium, and indium. The n-doped AlN layer 124 is above and in contact with the n-type III-nitride layer 123. It should be pointed out that “Al” of the n-doped AlN layer 124 refers to aluminum. “N” of the n-doped AlN layer 124 refers to nitrogen. The active layer 122 is between the p-type GaN layer 121 and the n-type III-nitride layer 123. The transparent top electrode 130 at least partially covers and is in contact with the n-doped AlN layer 124.

It should be pointed out that since the n-doped AlN layer 124 contains aluminum relative to the n-type III-nitride layer 123, the band gap of the n-doped AlN layer 124 is larger than the band gap of the n-type III-nitride layer 123. In general, the refractive index of the n-doped AlN layer 124 with the larger band gap will be smaller than the refractive index of the n-type III-nitride layer 123 with the smaller band gap. In some embodiments, a refractive index of the transparent top electrode 130 is smaller than the refractive index of the n-doped AlN layer 124. In other words, the refractive index of the n-doped AlN layer 124 is between the refractive index of the n-type III-nitride layer 123 and the refractive index of the transparent top electrode 130. According to Snell’s Law, the phenomenon of refraction occurs when light propagates from one medium to another medium with a different refractive index. When the difference in refractive index between the two mediums is large, more light will be reflected at the interface between the two mediums. In detail, assuming that light travels from an optically dense medium (e.g., the n-type III-nitride layer 123) with a refractive index of n1 to an optically sparser medium (e.g., the n-doped AlN layer 124) with a refractive index of n2 smaller than n1, and the incident angle θ1 is equal to the critical angle θc, the refracted ray will proceed along the tangent of the interface. The critical angle θc is the smallest angle of incidence at which total internal reflection occurs and can be determined by the following equation (1).

$$\theta c = \sin^{-1}(n2/n1) \qquad (1)$$

Figure 2:
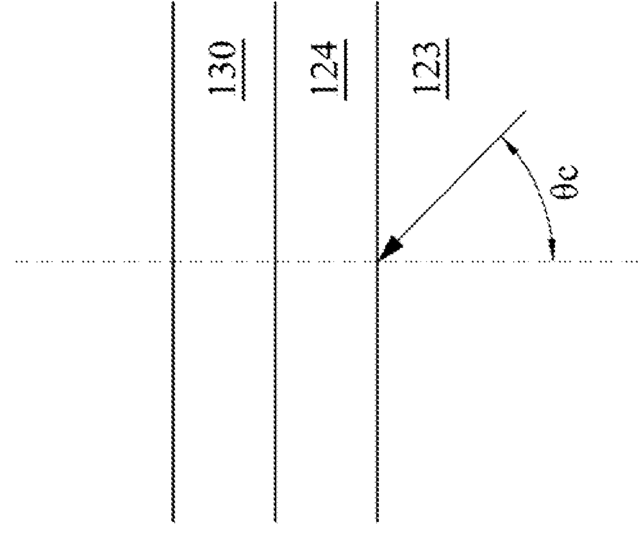
FIG. 2 is a schematic diagram showing two structures.
Figure 2:
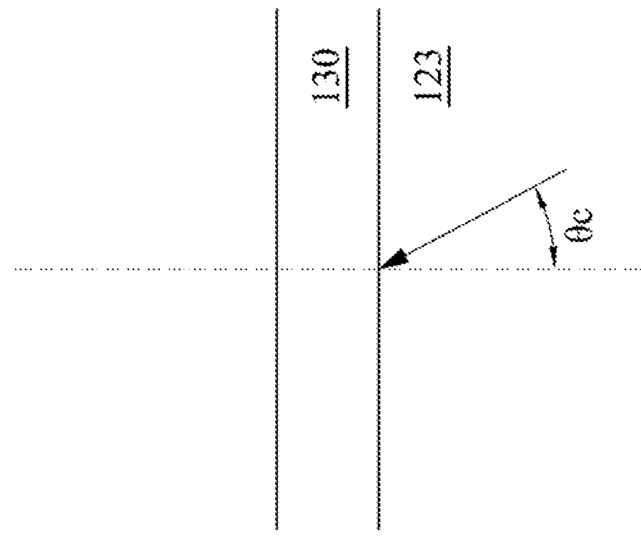

According to the above equation, it can be seen that the refractive index of n2 with a larger value can make the critical angle θc larger. That is, less light will be reflected at the interface between the two mediums. Reference is made to FIG. 2. FIG. 2 is a schematic diagram showing two structures, in which the left structure includes the n-type III-nitride layer 123 and the transparent top electrode 130 stacked thereon, and the right structure includes the n-type III-nitride layer 123, the n-doped AlN layer 124, and the transparent top electrode 130 sequentially stacked. Since the n-doped AlN layer 124 of the right structure in FIG. 2 has a larger refractive index than the transparent top electrode 130 of the left structure in FIG. 2, the right structure has a larger critical angle θc than the left structure. Therefore, compared with the left structure with only the n-type III-nitride layer 123 and the transparent top electrode 130 stacked, the right structure with the n-type III-nitride layer 123, the n-doped AlN layer 124, and the transparent top electrode 130 can have better light extraction efficiency.

In some embodiments, the refractive index of the n-type III-nitride layer 123 may be 2.5, and the refractive index of the n-doped AlN layer 124 is between 2.0 and 2.5. Since the difference in refractive index between the n-type III-nitride layer 123 and the n-doped AlN layer 124 is appropriately small, more light propagating in the n-type III-nitride layer 123 can enter the n-doped AlN layer 124 (i.e., less light is reflected at the interface between the n-type III-nitride layer 123 and the n-doped AlN layer 124). In this way, the light extraction efficiency of the micro light-emitting diode 120 can be effectively improved.

In some embodiments, the thickness of the n-doped AlN layer 124 may be greater than 10 nm. In this way, the n-doped AlN layer 124 may have sufficient thickness to appear the effect of refractive index matching.

In some embodiments, the substrate 110 having the metal pad 111 thereon is a receiving substrate. For example, the receiving substrate may be, but is not limited to, a display substrate.

In some embodiments, the thickness of the n-doped AlN layer 124 may be greater than 80 nm. In this way, the n-doped AlN layer 124 with the larger thickness can make the effect of refractive index matching appear more significantly. In addition, the flexibility of the processes of manufacturing the micro light-emitting diode 120 can be significantly increased.

In some embodiments, a sum of thicknesses of the p-type GaN layer 121, the active layer 122, the n-type III-nitride layer 123, and the n-doped AlN layer 124 is greater than 400 nm. In this way, the micro light-emitting diode 120 can have sufficient strength to cope with subsequent transferring processes.

In some embodiments, a sum of the thicknesses of the n-type III-nitride layer and the n-doped AlN layer is greater than a sum of the thicknesses of the active layer and the p-type GaN layer. In this way, the insulation distance between the transparent top electrode 130 and the metal pad 111 can be increased to reduce the possibility of electrical short.

In some embodiments, the thickness of the n-type III-nitride layer is greater than the sum of the thickness of the active layer and the thickness of the p-type GaN layer. In this way, the insulation distance between the transparent top electrode 130 and the metal pad 111 can also be increased to reduce the possibility of electrical short.

In some embodiments, the thickness of the n-type III-nitride layer is greater than 0.5 μm. It makes the isolation layer 140 easier to be thicker to avoid the electrical short.

In some embodiments, the transparent top electrode 130 is made of transparent conductive oxide. For example, the transparent conductive oxide may include ITO (Indium Tin Oxide), IZO (indium tin oxide), and AZO (aluminum zinc oxide), but the disclosure is not limited in this regard. In this way, more light propagating in the n-type III-nitride layer 123 can enter the transparent top electrode 130 via the n-doped AlN layer 124 with less reflection, such that the light extraction efficiency of the micro light-emitting diode 120 can be further improved.

Figure 3:
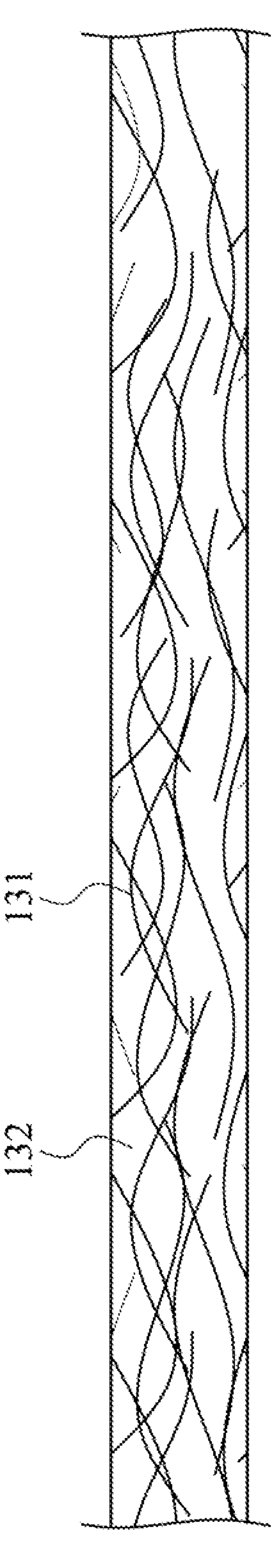
FIG. 3 is a partial schematic cross-sectional view of a transparent top electrode according to some embodiments of the present disclosure.

Reference is made to FIG. 3. FIG. 3 is a partial schematic cross-sectional view of a transparent top electrode 130 according to some embodiments of the present disclosure. As shown in FIG. 3, in some embodiments, the transparent top electrode 130 includes nano metal wires 131 and an encapsulation material 132 in which the nano metal wires 131 are embedded. The refractive index of the encapsulation material 132 can be regarded as the refractive index of the transparent top electrode 130. The refractive index of the encapsulation material 132 is smaller than the refractive index of the n-doped AlN layer 124. In this way, more light propagating in the n-type III-nitride layer 123 can enter the encapsulation material 132 of the transparent top electrode 130 via the n-doped AlN layer 124 with less reflection, such that the light extraction efficiency of the micro light-emitting diode 120 can be further improved.

As shown in FIG. 1, in some embodiments, the micro light-emitting diode device 100A further includes an isolation layer 140. The isolation layer 140 is on the substrate 110 and surrounds the micro light-emitting diode 120. A height H2 of the isolation layer 140 relative to the substrate 110 is equal to or smaller than a height H1 of a top surface of the n-doped AlN layer 124 relative to the substrate 110. In this way, the contact area between the micro light-emitting diode 120 and the transparent top electrode 130 is larger, so the resistance can be smaller. In addition, the upward light-emitting efficiency of the micro light-emitting diode device 100A can be better (because the isolation layer 140 does not cover the top surface of the n-doped AlN layer 124).

In some embodiments, a refractive index of the isolation layer 140 is smaller than the refractive index of the transparent top electrode 130. That is, the difference in refractive index between the n-type III-nitride layer 123 and the isolation layer 140 will be greater than the difference in refractive index between the n-type III-nitride layer 123 and the n-doped AlN layer 124. In this way, more light will be reflected at the interface between the n-type III-nitride layer 123 and the isolation layer 140 than the interface between the n-type III-nitride layer 123 and the n-doped AlN layer 124, so that the upward light-emitting efficiency of the micro light-emitting diode device 100A can be further improved.

In some embodiments, the isolation layer 140 includes resin, but the disclosure is not limited in this regard.

Figure 4:
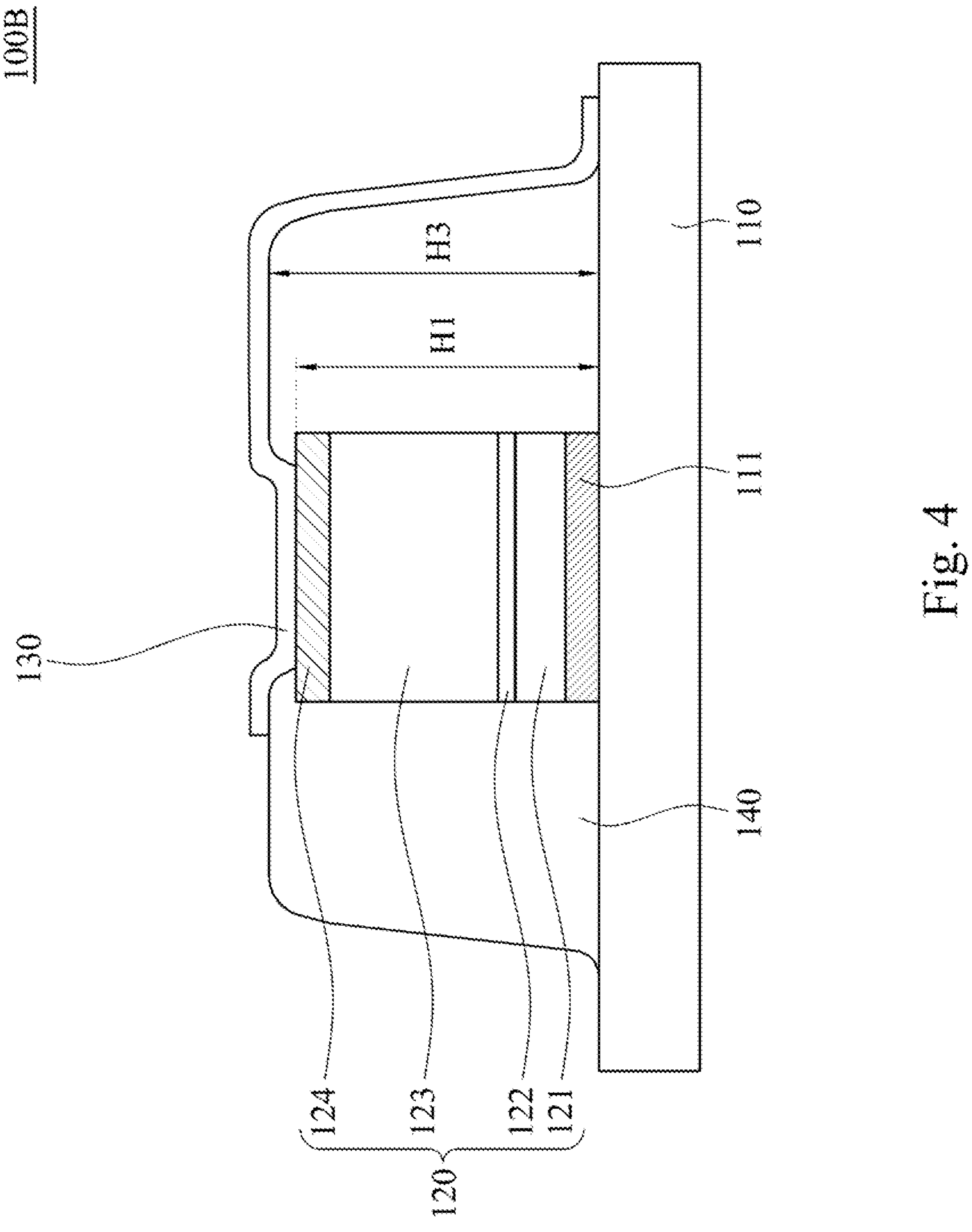
FIG. 4 is a schematic cross-sectional view of a micro light-emitting diode device according to some embodiments of the present disclosure.

Reference is made to FIG. 4. FIG. 4 is a schematic cross-sectional view of a micro light-emitting diode device 100B according to some embodiments of the present disclosure. As shown in FIG. 4, in some embodiments, the micro light-emitting diode device 100B includes a substrate 110, a micro light-emitting diode 120, a transparent top electrode 130, and an isolation layer 140. A difference between the embodiments shown in FIGS. 1 and 4 is that a height H3 of the isolation layer 140 as shown in FIG. 4 relative to the substrate 110 is greater than the height H1 of the top surface of the n-doped AlN layer 124 relative to the substrate 110. In this way, the thickness of the isolation layer 140 shown in FIG. 4 is larger (compared to the isolation layer 140 shown in FIG. 1), which is beneficial to increase the production yield rate of the micro light-emitting diode device 100B.

Figure 5:
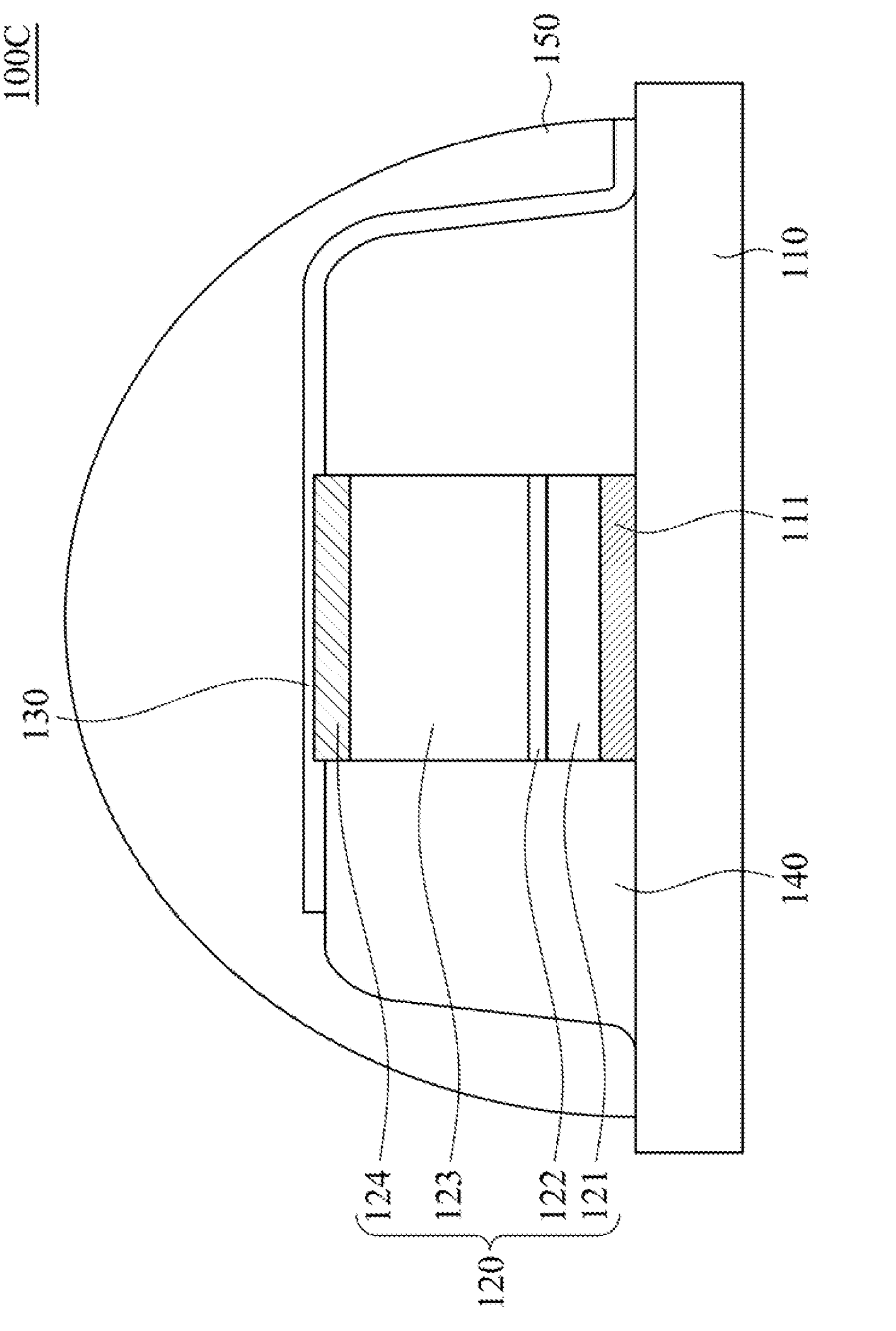
FIG. 5 is a schematic cross-sectional view of a micro light-emitting diode device according to some embodiments of the present disclosure.

Reference is made to FIG. 5. FIG. 5 is a schematic cross-sectional view of a micro light-emitting diode device 100C according to some embodiments of the present disclosure. As shown in FIG. 5, in some embodiments, the micro light-emitting diode device 100C includes a substrate 110, a micro light-emitting diode 120, a transparent top electrode 130, and an isolation layer 140. A difference between the embodiments shown in FIGS. 1 and 5 is that the micro light-emitting diode device 100C as shown in FIG. 5 further includes an encapsulation layer 150. The encapsulation layer 150 is above and in contact with the transparent top electrode 130. Specifically, the encapsulation layer 150 encapsulates the micro light-emitting diode 120, the transparent top electrode 130, and the isolation layer 140. A refractive index of the encapsulation layer 150 is smaller than the refractive index of the transparent top electrode 130. In this way, more light propagating in the n-type III-nitride layer 123 can enter the encapsulation layer 150 sequentially via the n-doped AlN layer 124 and the transparent top electrode 130 with less reflection, such that the light extraction efficiency of the micro light-emitting diode 120 can be further improved.

Figure 6:
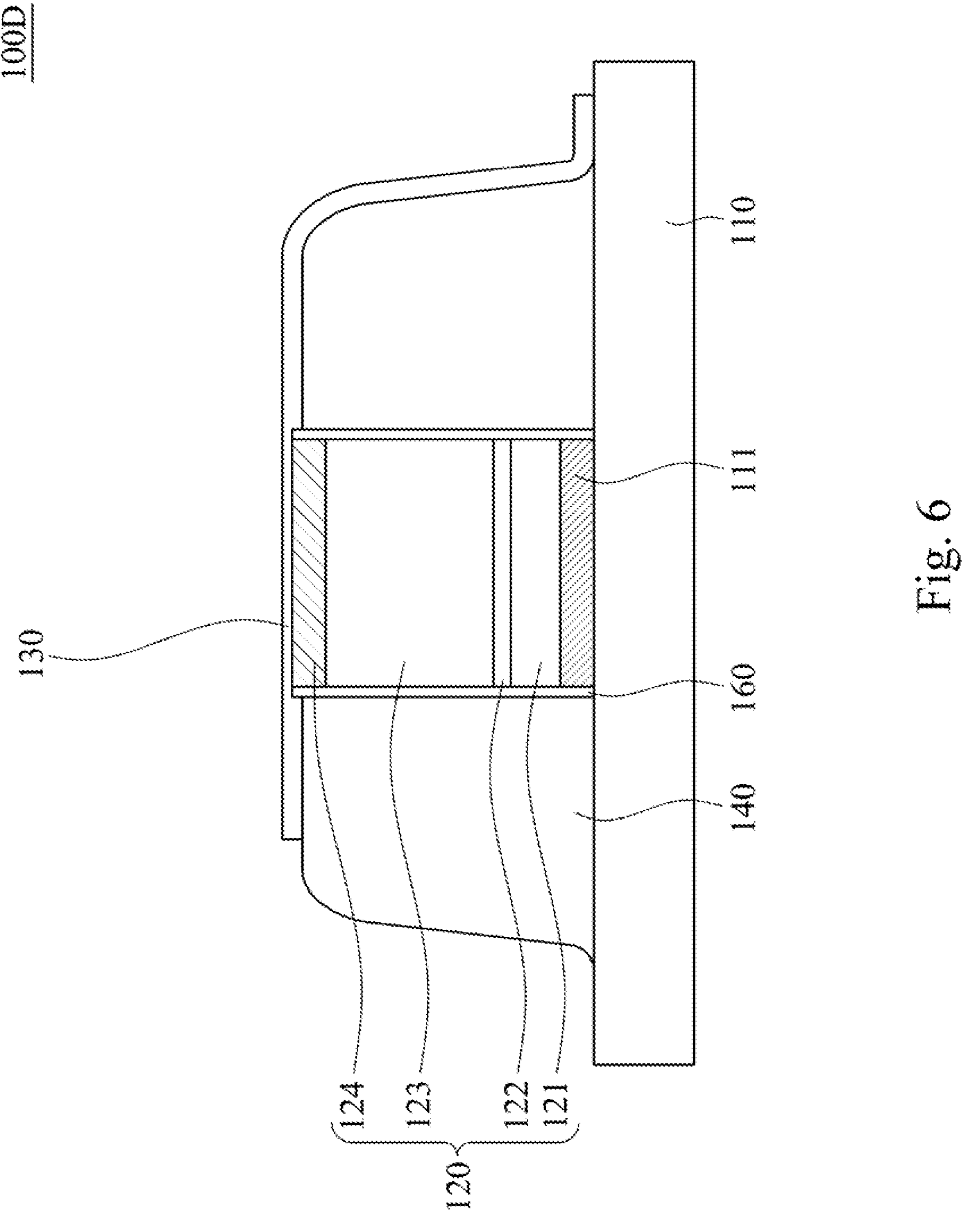
FIG. 6 is a schematic cross-sectional view of a micro light-emitting diode device according to some embodiments of the present disclosure.

Reference is made to FIG. 6. FIG. 6 is a schematic cross-sectional view of a micro light-emitting diode device 100D according to some embodiments of the present disclosure. As shown in FIG. 6, in some embodiments, the micro light-emitting diode device 100D includes a substrate 110, a micro light-emitting diode 120, a transparent top electrode 130, and an isolation layer 140. A difference between the embodiments shown in FIGS. 1 and 6 is that the micro light-emitting diode device 100D as shown in FIG. 6 further includes a dielectric layer 160. The dielectric layer 160 is between the isolation layer 140 and a side surface of the micro light-emitting diode 120. The dielectric layer 16 can reduce surface recombination on the side surface of the micro light-emitting diode 120 and thus it may improve the radiative recombination rate of the micro light-emitting diode 120.

Figure 7:
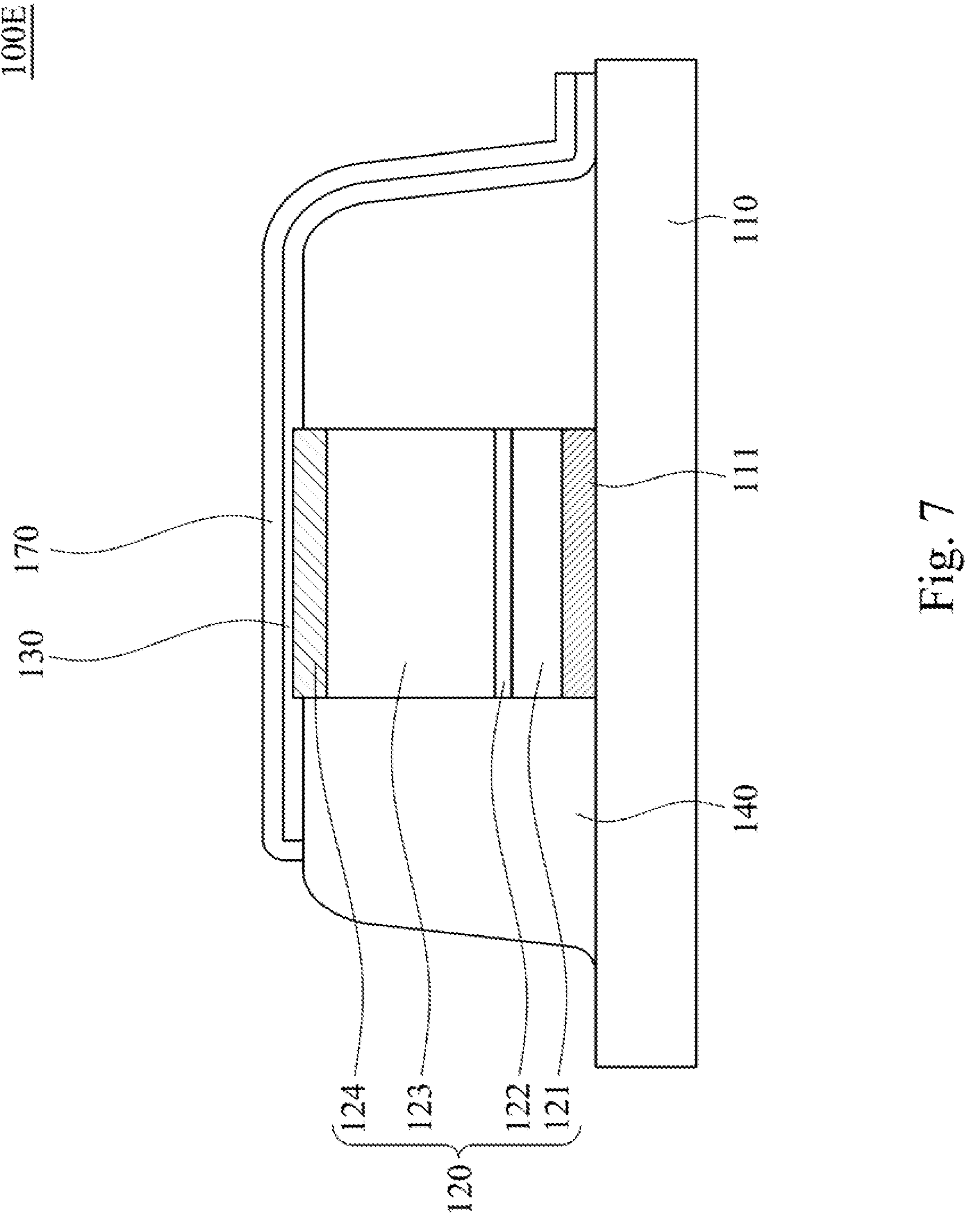
FIG. 7 is a schematic cross-sectional view of a micro light-emitting diode device according to some embodiments of the present disclosure.

Reference is made to FIG. 7. FIG. 7 is a schematic cross-sectional view of a micro light-emitting diode device 100E according to some embodiments of the present disclosure. As shown in FIG. 7, in some embodiments, the micro light-emitting diode device 100E includes a substrate 110, a micro light-emitting diode 120, a transparent top electrode 130, and an isolation layer 140. A difference between the embodiments shown in FIGS. 1 and 7 is that the micro light-emitting diode device 100E further includes an MgO layer 170. The MgO layer 170 covers and is in contact with the transparent top electrode 130. A refractive index of the MgO layer 170 is smaller than the refractive index of the transparent top electrode 130. In this way, more light propagating in the n-type III-nitride layer 123 can enter the MgO layer 170 sequentially via the n-doped AlN layer 124 and the transparent top electrode 130 with less reflection, such that the light extraction efficiency of the micro light-emitting diode 120 can be further improved.

Figure 8:
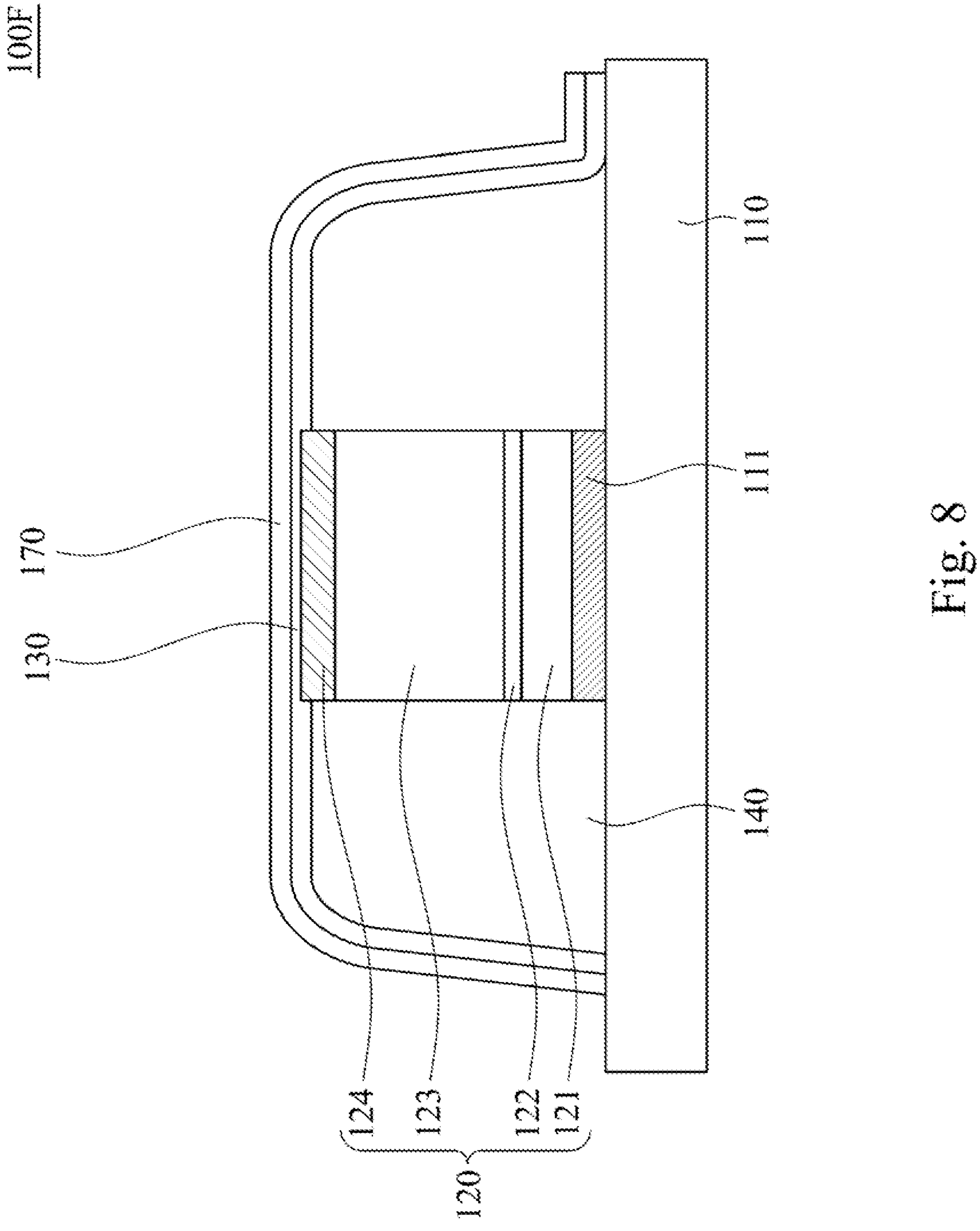
FIG. 8 is a schematic cross-sectional view of a micro light-emitting diode device according to some embodiments of the present disclosure.

Reference is made to FIG. 8. FIG. 8 is a schematic cross-sectional view of a micro light-emitting diode device 100F according to some embodiments of the present disclosure. As shown in FIG. 8, in some embodiments, the micro light-emitting diode device 100F includes a substrate 110, a micro light-emitting diode 120, a transparent top electrode 130, an isolation layer 140, and an MgO layer 170. A difference between the embodiments shown in FIGS. 7 and 8 is that the transparent top electrode 130 and the MgO layer 170 of the micro light-emitting diode device 100F have larger coverage areas. In this way, the light output distribution of the micro light-emitting diode device 100F can be more symmetric.

Figure 9:
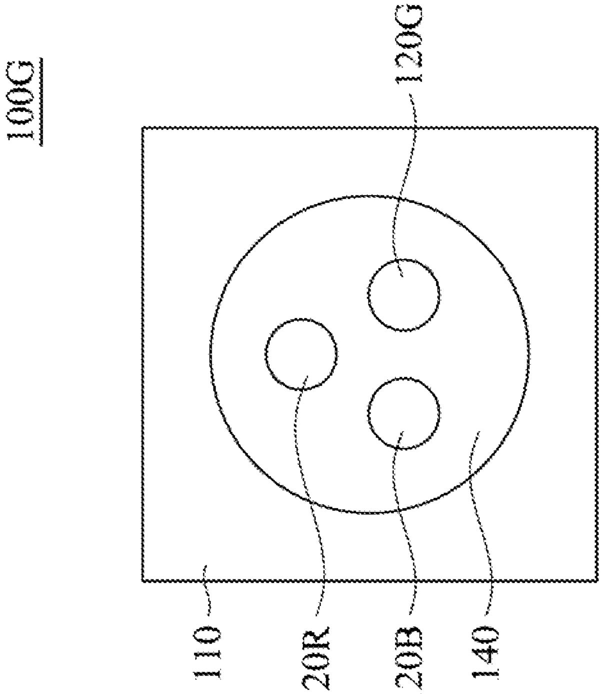
FIG. 9 is a schematic top view of a micro light-emitting diode device according to some embodiments of the present disclosure.

Reference is made to FIG. 9. FIG. 9 is a schematic top view of a micro light-emitting diode device 100G according to some embodiments of the present disclosure. As shown in FIG. 9, the micro light-emitting diode device 100G includes a substrate 110, a plurality of micro light-emitting diodes 120R, 120G, 120B, and an isolation layer 140. The micro light-emitting diodes 120R, 120G, 120B are disposed on the substrate 110. Each of the micro light-emitting diodes 120R, 120G, 120B has a structure similar to that of the micro light-emitting diode 120 shown in FIG. 1 and has a lateral width smaller than 100 μm. The isolation layer 140 is disposed on the substrate 110 and surrounds the micro light-emitting diodes 120R, 120G, 120B. The micro light-emitting diodes 120R, 120G, 120B are configured to emit lights of different wavelengths respectively. For example, the micro light-emitting diodes 120R, 120G, 120B are configured to emit a red light, a green light, and a blue light. Since the micro light-emitting diodes 120R, 120G, 120B are surrounded by the same isolation layer 140, lights emitted by the micro light-emitting diodes 120R, 120G, 120B can be evenly mixed.

In some embodiments, a distance of any two of the micro light-emitting diodes 120R, 120G, 120B is less than 2 mm. In this way, lights emitted by the micro light-emitting diodes 120R, 120G, 120B can be mixed more evenly.

Figure 10:
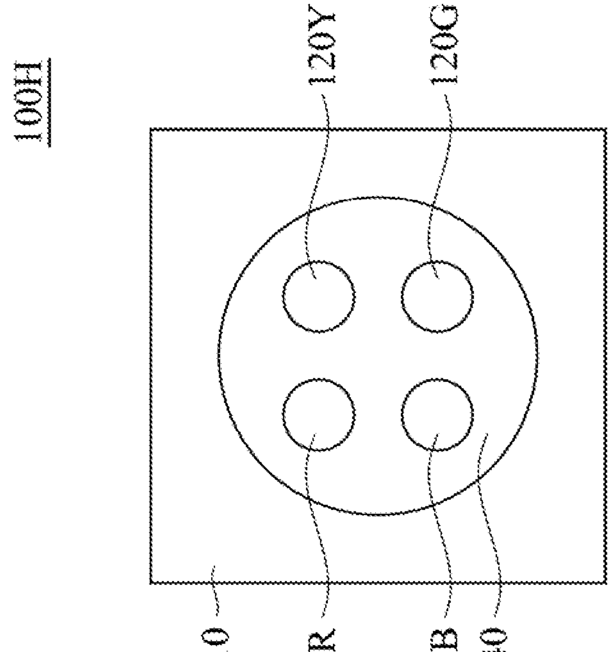
FIG. 10 is a schematic top view of a micro light-emitting diode device according to some embodiments of the present disclosure.

Reference is made to FIG. 10. FIG. 10 is a schematic top view of a micro light-emitting diode device 100H according to some embodiments of the present disclosure. Compared to the micro light-emitting diode device 100G shown in FIG. 9, the micro light-emitting diode device 100H further includes a micro light-emitting diode 120Y. The micro light-emitting diode 120Y is also surrounded by the isolation layer 140, and is configured to emit a yellow light. Since the micro light-emitting diodes 120R, 120G, 120B, 120Y are surrounded by the same isolation layer 140, lights emitted by the micro light-emitting diodes 120R, 120G, 120B, 120Y can be evenly mixed. In some embodiments, a distance of any two of the micro light-emitting diodes 120R, 120G, 120B, 120Y is less than 2 mm. In this way, lights emitted by the micro light-emitting diodes 120R, 120G, 120B, 120Y can be mixed more evenly.

According to the foregoing recitations of the embodiments of the disclosure, it can be seen that in the micro light-emitting diode device of the disclosure, the micro light-emitting diode includes the n-doped AlN layer that contains aluminum relative to the n-type III-nitride layer, so the refractive index of the n-doped AlN layer with the larger band gap will be smaller than the refractive index of the n-type III-nitride layer with the smaller band gap, which can effectively improve the light extraction efficiency of the micro light-emitting diode.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light-emitting diode device, comprising:

a substrate;

a micro light-emitting diode having a lateral width smaller than 100 μm, disposed on the substrate, and comprising:

a p-type GaN layer;

an n-type III-nitride layer above the p-type GaN layer, wherein III refers to at least one of aluminum, gallium, and indium;

an n-doped AlN layer above and in contact with the n-type III-nitride layer, wherein a thickness of the n-doped AlN layer is greater than 10 nm; and an active layer which emits light and is between the p-type GaN layer and the n-type III-nitride layer; and a transparent top electrode at least partially covering and in contact with the n-doped AlN layer, wherein a refractive index of the n-doped AlN layer is smaller than a refractive index of the n-type III-nitride layer, wherein a sum of thicknesses of the p-type GaN layer, the active layer, the n-type III-nitride layer, and the n-doped AlN layer is greater than 400 nm, wherein a sum of the thicknesses of the n-type III-nitride layer and the n-doped AlN layer is greater than a sum of the thicknesses of the active layer and the p-type GaN layer.

2. The micro light-emitting diode device of claim 1, wherein the thickness of the n-doped AlN layer is greater than 80 nm.

3. The micro light-emitting diode device of claim 1, wherein the thickness of the n-type III-nitride layer is greater than 0.5 μm.

4. The micro light-emitting diode device of claim 1, wherein the thickness of the n-type III-nitride layer is greater than the sum of the thickness of the active layer and the thickness of the p-type GaN layer.

5. The micro light-emitting diode device of claim 1, further comprising:

an isolation layer on the substrate and surrounding the micro light-emitting diode, wherein a height of the isolation layer relative to the substrate is equal to or smaller than a height of a top surface of the n-doped AlN layer relative to the substrate.

6. The micro light-emitting diode device of claim 5, wherein a refractive index of the isolation layer is smaller than the refractive index of the transparent top electrode.

7. The micro light-emitting diode device of claim 5, further comprising:

a dielectric layer between the isolation layer and a side surface of the micro light-emitting diode.

8. The micro light-emitting diode device of claim 1, wherein the transparent top electrode is made of transparent conductive oxide, and a refractive index of the transparent top electrode is smaller than the refractive index of the n-doped AlN layer.

9. The micro light-emitting diode device of claim 1, wherein the transparent top electrode comprises nano metal wires, the transparent top electrode further comprises an encapsulation material in which the nano metal wires are embedded, and a refractive index of the encapsulation material is smaller than the refractive index of the n-doped AlN layer.

10. The micro light-emitting diode device of claim 1, further comprising:

an isolation layer on the substrate and surrounding the micro light-emitting diode, wherein a height of the isolation layer relative to the substrate is greater than a height of a top surface of the n-doped AlN layer relative to the substrate.

11. The micro light-emitting diode device of claim 10, wherein a refractive index of the isolation layer is smaller than the refractive index of the transparent top electrode.

12. The micro light-emitting diode device of claim 10, further comprising:

a dielectric layer between the isolation layer and a side surface of the micro light-emitting diode.

13. The micro light-emitting diode device of claim 1, further comprising:

an encapsulation layer above and in contact with the transparent top electrode, wherein a refractive index of the encapsulation layer is smaller than the refractive index of the transparent top electrode.

14. The micro light-emitting diode device of claim 1, further comprising:

an MgO layer covering and in contact with the transparent top electrode, wherein a refractive index of the MgO layer is smaller than the refractive index of the transparent top electrode.

15. The micro light-emitting diode device of claim 1, further comprising:

at least one additional micro light-emitting diode disposed on the substrate, wherein a distance between the micro light-emitting diode and the at least one additional micro light-emitting diode is less than 2 mm; and an isolation layer on the substrate and surrounding the micro light-emitting diode and the at least one additional micro light-emitting diode.

16. The micro light-emitting diode device of claim 15, wherein the micro light-emitting diode and the at least one additional micro light-emitting diode are configured to emit lights of different wavelengths respectively.

17. The micro light-emitting diode device of claim 16, wherein a number of the at least one additional micro light-emitting diode is two, and the lights of different wavelengths comprise a red light, a green light, and a blue light.

18. The micro light-emitting diode device of claim 16, wherein a number of the at least one additional micro light-emitting diode is three, and the lights of different wavelengths comprise a red light, a green light, a blue light, and a yellow light.

* * * * *